(12) United States Patent
Onishi et al.

(10) Patent No.: US 11,005,486 B2
(45) Date of Patent: May 11, 2021

(54) ATOMIC OSCILLATOR AND FREQUENCY SIGNAL GENERATION SYSTEM

(71) Applicant: Seiko Epson Corporation, Tokyo (JP)

(72) Inventors: Yasunori Onishi, Shiojiri (JP); Koji Chindo, Chino (JP); Nobuhito Hayashi, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/802,701

(22) Filed: Feb. 27, 2020

(65) Prior Publication Data

US 2020/0280319 A1 Sep. 3, 2020

(30) Foreign Application Priority Data

Feb. 28, 2019 (JP) .............................. JP2019-036991

(51) Int. Cl.
*H03L 7/26* (2006.01)
*H01S 5/0687* (2006.01)
*H03L 7/02* (2006.01)

(52) U.S. Cl.
CPC .............. *H03L 7/26* (2013.01); *H01S 5/0687* (2013.01); *H03L 7/02* (2013.01)

(58) Field of Classification Search
CPC ........................................................ H03L 7/26
USPC ........................................................ 331/94.1
See application file for complete search history.

(56) References Cited

U.S. PATENT DOCUMENTS

2009/0302956 A1* 12/2009 Matsuura ................ H03L 1/022
331/94.1
2017/0141783 A1  5/2017 Tanaka et al.

FOREIGN PATENT DOCUMENTS

| JP | H10-281883 A | 10/1998 |
|----|--------------|---------|
| JP | 2017-050665 A | 3/2017 |
| JP | 2017-059865 A | 3/2017 |
| JP | 2017-092796 A | 5/2017 |

* cited by examiner

*Primary Examiner* — Joseph Chang
(74) *Attorney, Agent, or Firm* — Harness, Dickey & Pierce, P.L.C.

(57) ABSTRACT

An atomic oscillator includes: an atom cell in which alkali metal atoms are accommodated; a light-emitting element that emits light beams for exciting the alkali metal atoms toward the atom cell; a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member; a temperature control element that controls a temperature of the first member; a heater that is thermally coupled to the second member; and a light-receiving element that receives light beams passing through the atom cell.

8 Claims, 9 Drawing Sheets

ATOMIC OSCILLATOR AND FREQUENCY SIGNAL GENERATION SYSTEM

The present application is based on, and claims priority from JP Application Serial Number 2019-036991, filed Feb. 28, 2019, the disclosure of which is hereby incorporated by reference herein in its entirety.

BACKGROUND

1. Technical Field

The present disclosure relates to an atomic oscillator and a frequency signal generation system.

2. Related Art

An atomic oscillator that oscillates based on energy transition of alkali metal atoms such as rubidium atoms or cesium atoms is known. For example, an atomic oscillator described in JP-A-2017-092796 includes a gas cell in which alkali metal atoms are filled, a heater that heats the gas cell, a Peltier element that controls a temperature of the gas cell, and a magnetic shield that covers the components and has a magnetic shielding property. Since the gas cell is accommodated in the magnetic shield, magnetic fields in the gas cell can be stabilized.

However, in the atomic oscillator described in JP-A-2017-092796, the magnetic shield includes a box-shaped lid which covers the gas cell and a gas cell holding member. For this reason, for example, assuming that temperature distribution of the gas cell is to be formed, a temperature of the shield may affect temperature distribution of the atom cell, and as a result, the temperature stability of the atom cell may be reduced. Thus, the frequency stability of the atomic oscillator may be reduced.

SUMMARY

The present disclosure can be implemented as the following application examples.

An atomic oscillator according to an application example includes: an atom cell in which alkali metal atoms are accommodated; a light-emitting element that emits light beams for exciting the alkali metal atoms toward the atom cell; a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member; a temperature control element that controls a temperature of the first member; a heater that is thermally coupled to the second member; and a light-receiving element that receives light beams passing through the atom cell.

A frequency signal generation system according to an application example includes: an atomic oscillator; and a processor that processes a frequency signal from the atomic oscillator, in which, the atomic oscillator includes an atom cell in which alkali metal atoms are accommodated, a light-emitting element that emits light beams for exciting the alkali metal atoms toward the atom cell, a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member, a temperature control element that changes a temperature of the first member, a heater that is thermally coupled to the second member, and a light-receiving element that receives light beams passing through the atom cell.

DESCRIPTION OF EXEMPLARY EMBODIMENTS

Hereinafter, an atomic oscillator and a frequency signal generation system according to the present disclosure will be described in detail based on embodiments illustrated in the accompanying drawings.

Figure 1:
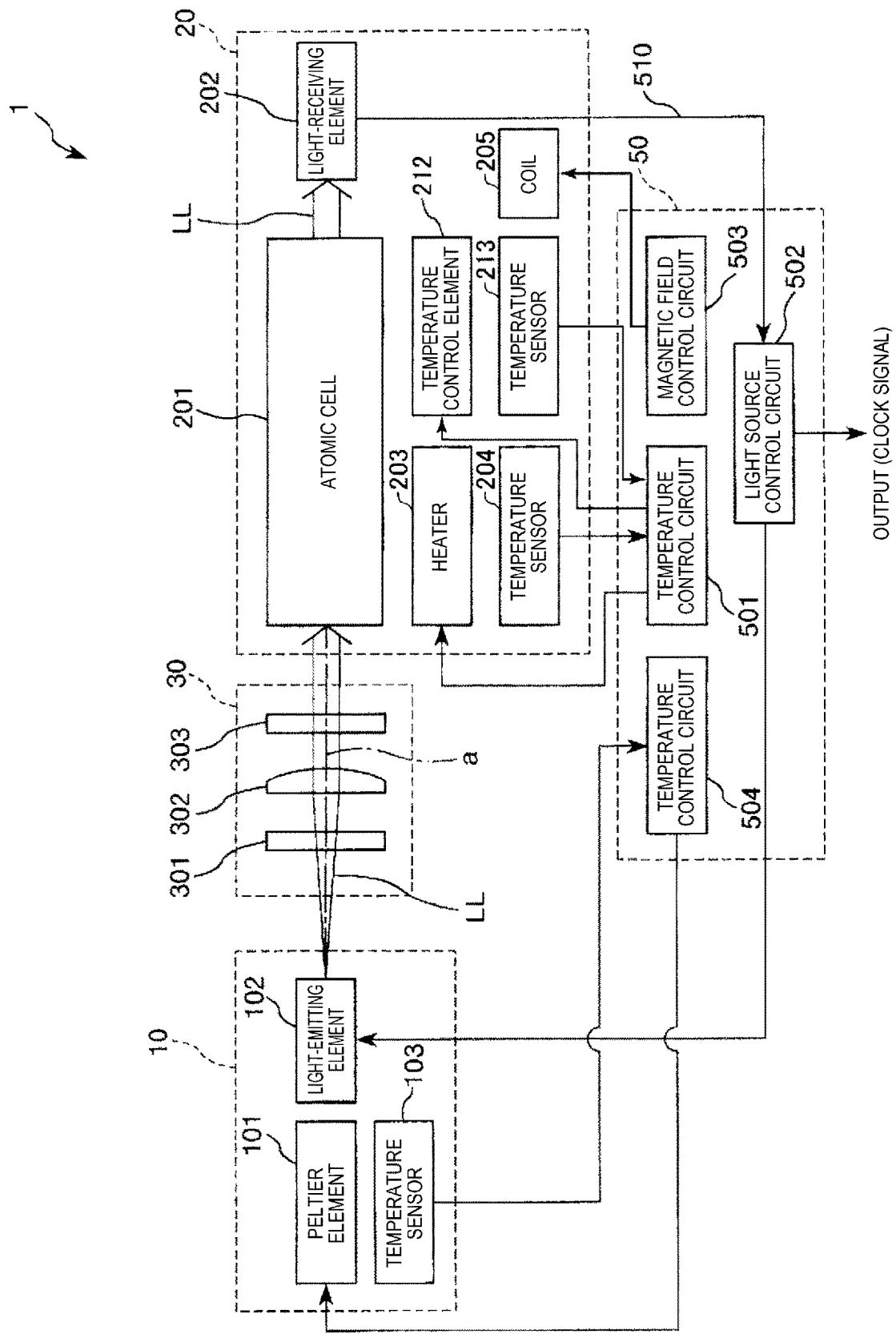
FIG. 1 is a schematic diagram illustrating an atomic oscillator according to a first embodiment.

FIG. 1 is a schematic diagram illustrating an atomic oscillator according to a first embodiment.

The atomic oscillator 1 illustrated in FIG. 1 is an atomic oscillator that uses a quantum interference effect which causes a phenomenon in which, when alkali metal atoms are simultaneously irradiated with two resonance light beams having specific different wavelengths, the two resonance light beams are transmitted without being absorbed by the alkali metal atoms. This phenomenon is also called an electromagnetically induced transparency (EIT) phenomenon.

As illustrated in FIG. 1, the atomic oscillator 1 includes a light-emitting element module 10, an atom cell unit 20, an optical system unit 30 provided between the light-emitting element module 10 and the atom cell unit 20, and a control circuit 50 that controls operations of the light-emitting element module 10 and the atom cell unit 20. Hereinafter, first, an outline of the atomic oscillator 1 will be described.

The light-emitting element module 10 includes a Peltier element 101, a light-emitting element 102, and a temperature sensor 103. The light-emitting element 102 emits linearly-polarized light beams LL including two types of light beams having different frequencies. In addition, the temperature sensor 103 detects a temperature of the light-emitting element 102. Further, the Peltier element 101 adjusts the temperature of the light-emitting element 102, that is, heats or cools the light-emitting element 102.

The optical system unit 30 includes a dimming filter 301, a condensing lens 302, and a quarter-wavelength plate 303, which are arranged along the optical axis a of the light beams LL. The dimming filter 301 reduces an intensity of the light beams LL from the light-emitting element 102. In addition, the condensing lens 302 adjusts radiation angles of the light beams LL such that the light beams LL are made close to, for example, parallel light beams. In addition, the quarter-wavelength plate 303 converts the two types of light beams having different frequencies, which are included in the light beams LL, from linearly-polarized light beams to circularly-polarized light beams, that is, right handed circularly-polarized light beams or left handed circularly-polarized light beams.

The atom cell unit 20 includes an atom cell 201, a light-receiving element 202, a heater 203, a temperature sensor 204, a coil 205, a temperature control element 212, and a temperature sensor 213.

The atom cell 201 has a property of transmitting the light beams LL, and the atom cell 201 is filled with alkali metal atoms. The alkali metal atom has energy levels of three levels including two different ground levels and an excited level. The light beams LL from the light-emitting element 102 enter the atom cell 201 via the dimming filter 301, the condensing lens 302, and the quarter-wavelength plate 303. The light-receiving element 202 receives the light beams LL passing through the atom cell 201, and outputs a signal corresponding to an intensity of the received light beams.

The heater 203 heats the alkali metal atoms in the atom cell 201, and thus at least some of the alkali metal atoms may be in a gas state with a desired concentration. In addition, the temperature sensor 204 detects a temperature of the atom cell 201. The coil 205 applies magnetic fields in a predetermined direction to the alkali metal atoms in the atom cell 201 to cause Zeeman splitting of the energy levels of the alkali metal atoms. In such a state where Zeeman splitting of the energy levels of the alkali metal atoms is caused, when the alkali metal atoms are irradiated with the circularly-polarized resonance light pair as described above, in a plurality of the energy levels of the alkali metal atoms of which Zeeman splitting is caused, the number of the alkali metal atoms at a desired energy level can be relatively larger than the number of the alkali metal atoms at other energy levels. Therefore, the number of atoms causing a desired EIT phenomenon increases, and a desired EIT signal, that is, a signal that appears in an output signal of the light-receiving element 202 according to the EIT phenomenon becomes large. As a result, an oscillation characteristic of the atomic oscillator 1, in particular, a short-term frequency stability can be improved.

The control circuit 50 includes a temperature control circuit 501, a light source control circuit 502, a magnetic field control circuit 503, and a temperature control circuit 504. The temperature control circuit 501 controls energization to the heater 203 based on a detection result of the temperature sensor 204 such that the temperature of the inside of the atom cell 201 becomes a desired temperature. In addition, the magnetic field control circuit 503 controls energization to the coil 205 such that the magnetic fields generated by the coil 205 are constant. Further, the temperature control circuit 504 controls energization to the Peltier element 101 based on a detection result of the temperature sensor 103 such that a temperature of the light-emitting element 102 becomes a desired temperature.

The light source control circuit 502 controls the frequencies of the two types of light beams included in the light beams LL from the light-emitting element 102 based on a detection result of the light-receiving element 202 such that the EIT phenomenon is caused. Here, when the two types of light beams become a resonance light pair having a frequency difference corresponding to an energy difference between the two ground levels of the alkali metal atoms in the atom cell 201, the EIT phenomenon is caused. Further, the light source control circuit 502 includes a voltage controlled oscillator (VCO) (not illustrated) of which the oscillation frequency is controlled to be stabilized in synchronization with a control of the frequencies of the two types of light beams, and outputs an output signal of the voltage controlled oscillator, as an output signal of the atomic oscillator 1, that is, a clock signal.

As above, the outline of the atomic oscillator 1 is described. Hereinafter, a more specific configuration of the atomic oscillator 1 will be described with reference to FIG. 2 to FIG. 6.

Figure 2:
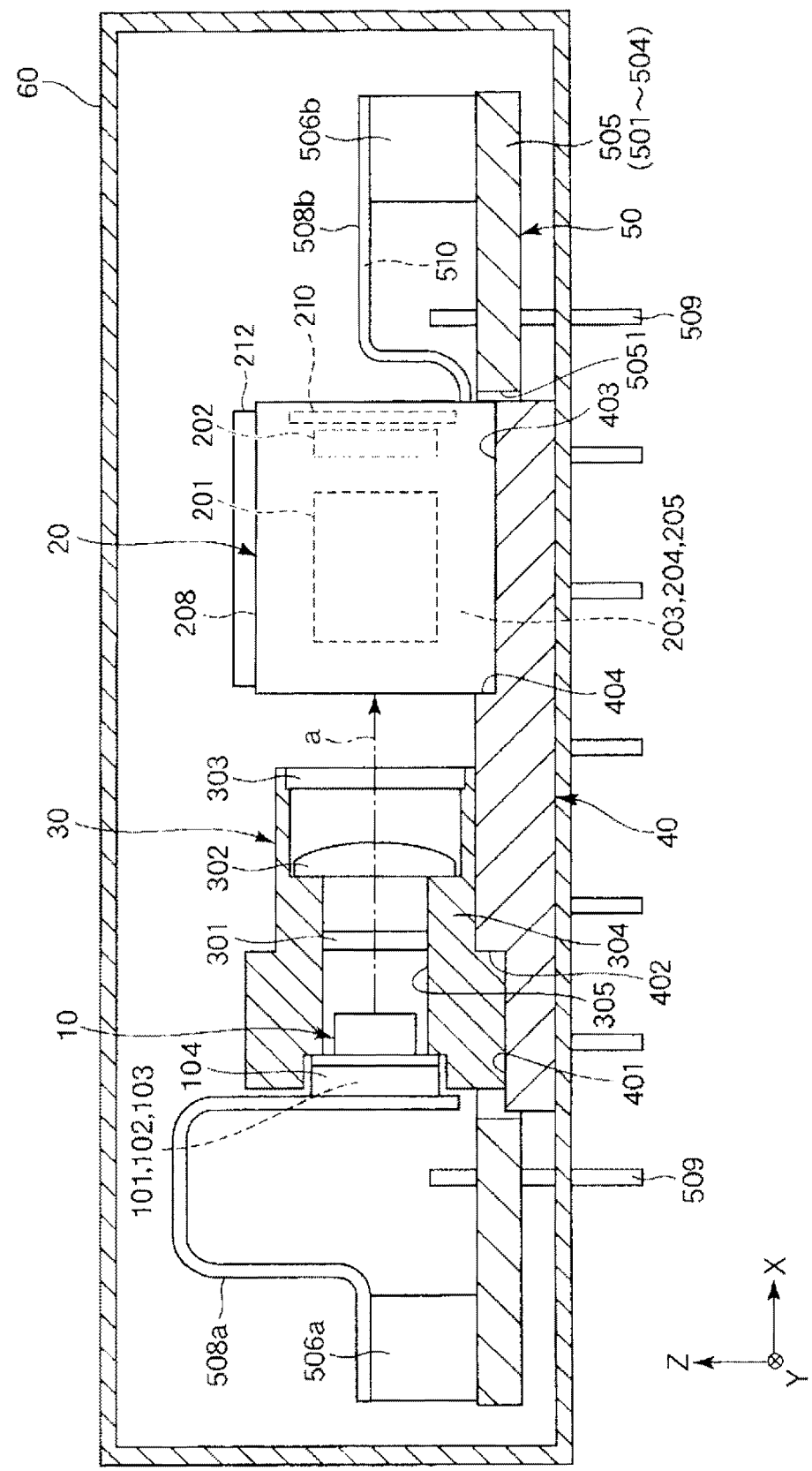
FIG. 2 is a sectional view of a side surface of the atomic oscillator according to the first embodiment, that is, a sectional view of the atomic oscillator along an XZ plane.
Figure 3:
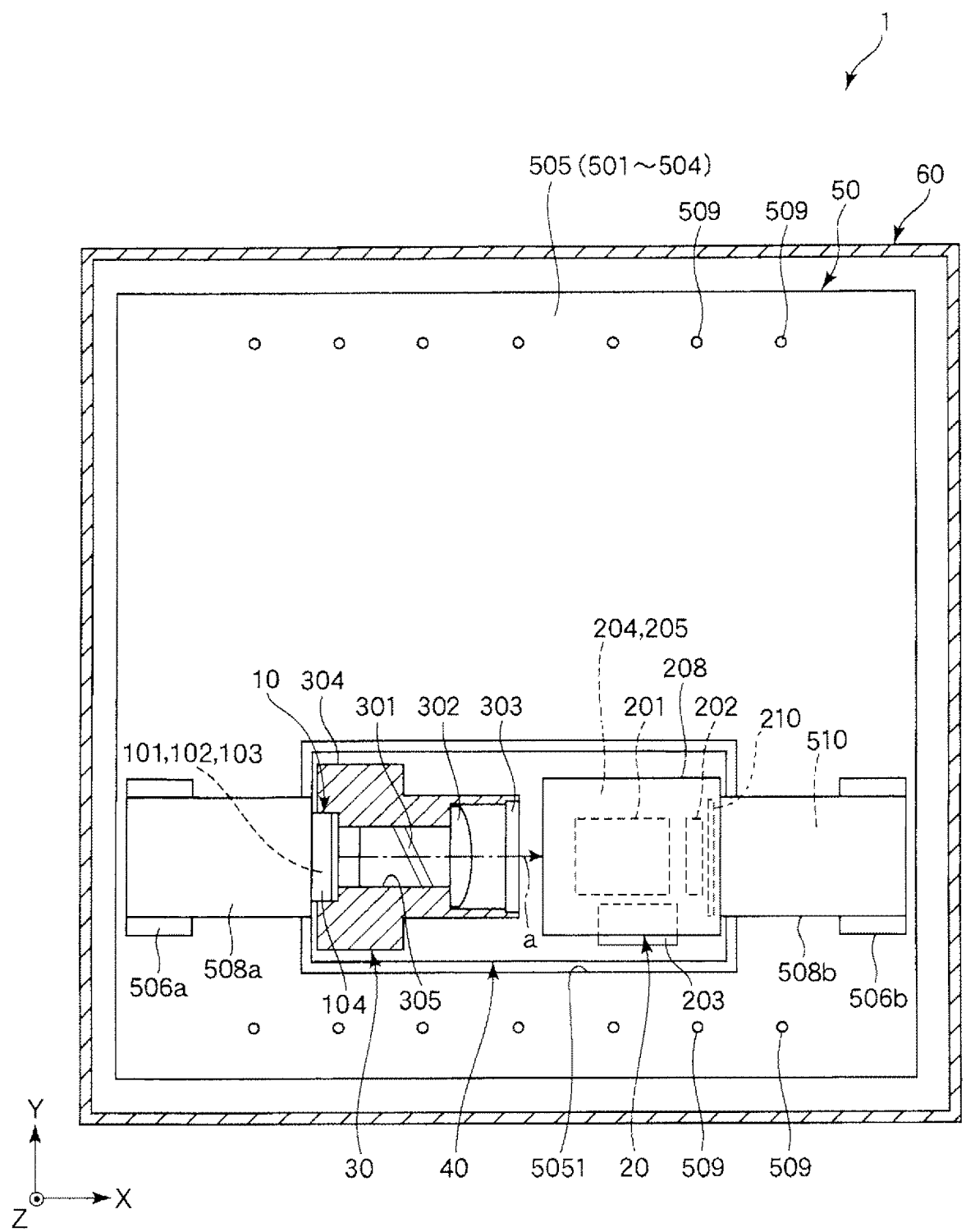
FIG. 3 is a sectional view of the atomic oscillator according to the first embodiment along an XY plane.
Figure 4:
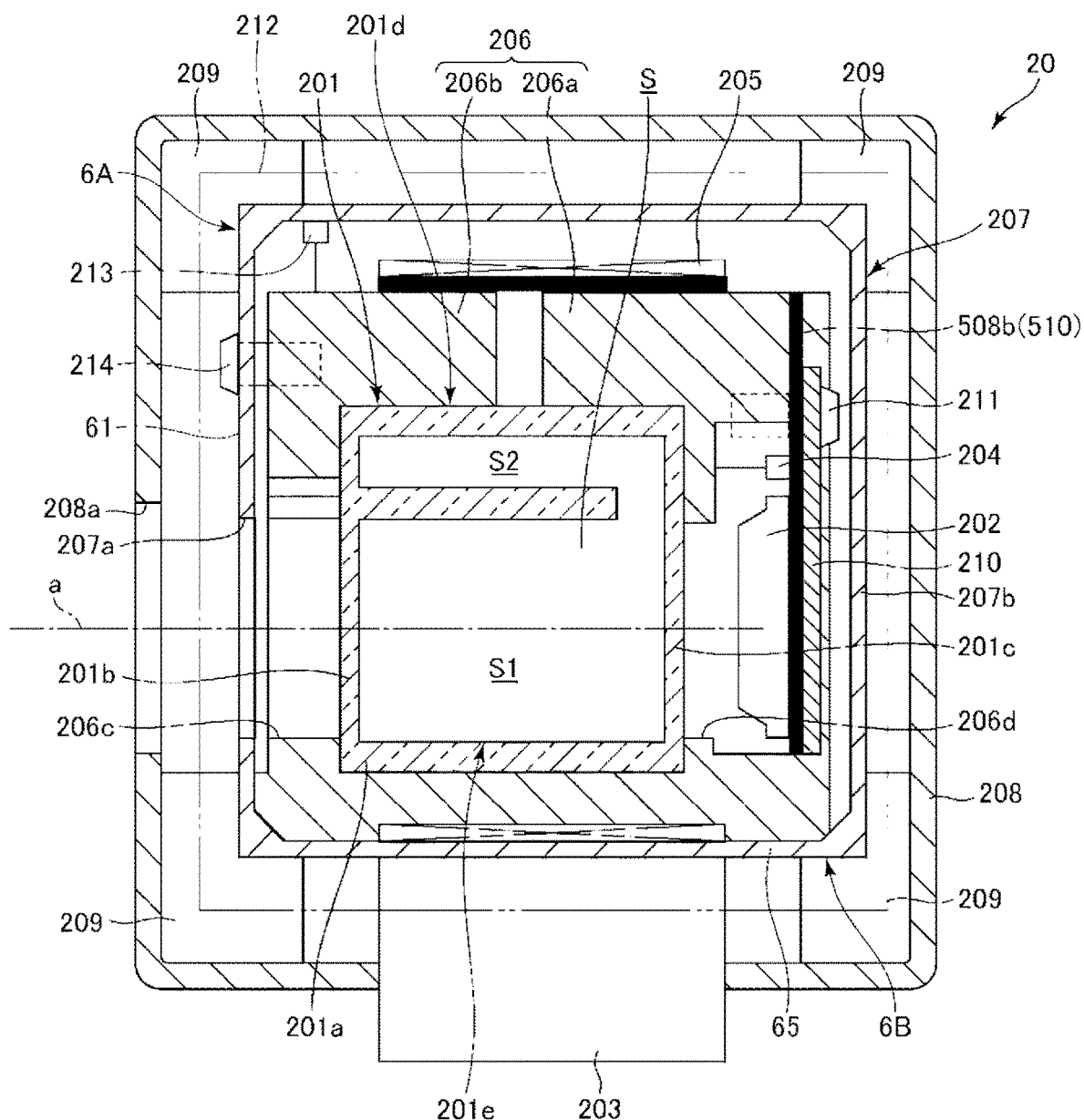
FIG. 4 is a sectional view of an atom cell unit included in the atomic oscillator according to the first embodiment along the XY plane.
Figure 4:
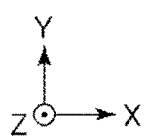
Figure 5:
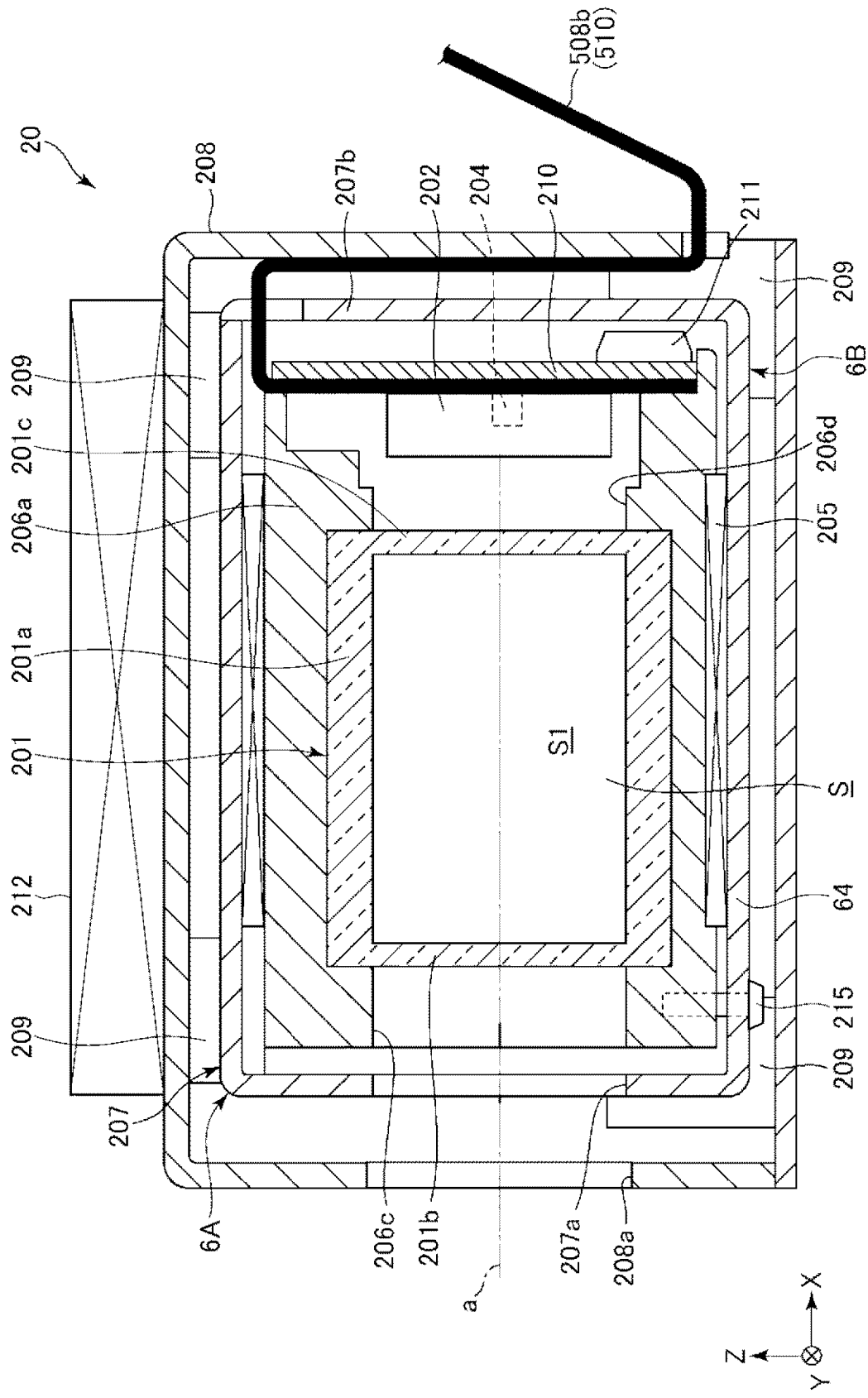
FIG. 5 is a sectional view of the atom cell unit included in the atomic oscillator according to the first embodiment along the XZ plane.
Figure 6:
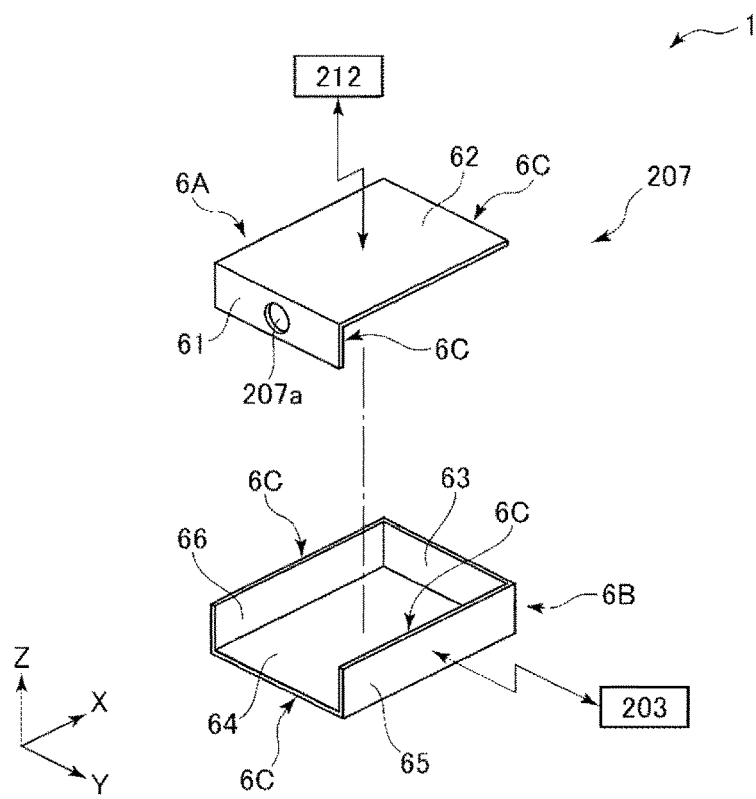
FIG. 6 is an exploded perspective view of a shield included in the atomic oscillator according to the first embodiment.

FIG. 2 is a sectional view of a side surface of the atomic oscillator according to the first embodiment, that is, a sectional view of the atomic oscillator along an XZ plane. FIG. 3 is a plan view of the atomic oscillator according to the first embodiment, that is, a sectional view of the atomic oscillator along an XY plane. FIG. 4 is a sectional view of the atom cell unit included in the atomic oscillator according to the first embodiment along the XY plane. FIG. 5 is a sectional view of the atom cell unit included in the atomic oscillator according to the first embodiment along the XZ plane. FIG. 6 is an exploded perspective view of a shield included in the atomic oscillator according to the first embodiment.

In the following, for convenience of explanation, the atomic oscillator according to the first embodiment will be described using an X axis, a Y axis, and a Z axis, which are three axes orthogonal to each other. In this specification, the Z axis is an axis perpendicular to a mounting surface 401 and a mounting surface 403 of a support member 40 to be described. The X axis is an axis along the light beams LL emitted from the light-emitting element module 10. In other words, the X axis is an axis along a direction in which the light-emitting element module 10 and the atom cell unit 20 are arranged. The Y axis is an axis perpendicular to the X axis and the Z axis. Further, a positive Z axis is a direction from the mounting surface 401 toward the light-emitting element module 10 along the Z axis, and a positive X axis is a direction from the light-emitting element module 10 toward the atom cell unit 20 along the X axis. In this specification, a left-handed coordinate system is employed, and thus a positive Y axis is determined based on the positive Z axis and the positive X axis. In the drawings, the positive direction is illustrated as a direction indicated by an arrow.

As illustrated in FIG. 2, the atomic oscillator 1 includes the light-emitting element module 10, the atom cell unit 20, the optical system unit 30 that supports the light-emitting element module 10, the support member 40 that collectively supports the atom cell unit 20 and the optical system unit 30, the control circuit 50 that is electrically coupled to the light-emitting element module 10 and the atom cell unit 20, and a package 60 that accommodates the components.

Light-Emitting Element Module

The light-emitting element module 10 includes the Peltier element 101, the light-emitting element 102, the temperature sensor 103, and a package 104 that accommodates the components.

Although not illustrated, the package 104 includes a base and a lid that are bonded to each other, and an airtight space is formed between the base and the lid, the airtight space being a space in which the Peltier element 101, the light-emitting element 102, and the temperature sensor 103 are accommodated. Preferably, the package 104 is in a depressurization (vacuum) state. Thereby, the light-emitting element 102, the temperature sensor 103, and the like in the package 104 are less likely to be affected by a temperature change outside the package 104, and thus temperature changes of the light-emitting element 102, the temperature sensor 103, and the like in the package 104 can be reduced. The package 104 may not be in a depressurization state, and may be filled with an inert gas such as nitrogen, helium, or argon.

Here, the base is made of, for example, a ceramic material having an insulating property. In addition, a plurality of coupling electrodes, which are electrically coupled to the Peltier element 101, the light-emitting element 102, and the temperature sensor 103, are provided on the inner surface of the base, and each of the coupling electrodes is electrically coupled to an external mount electrode provided on the outer surface of the base via a penetration electrode penetrating the base. On the other hand, the lid is made of, for example, a metal material such as Kovar having a linear expansion coefficient close to that of a ceramic material. The lid is bonded to the base by, for example, seam welding. Further, a hole through which the light beams LL from the light-emitting element 102 are transmitted is formed in the lid, and the hole is airtightly closed by a plate member having optical transparency such as a glass material. Although not illustrated, the Peltier element 101 is fixed to the inner surface of the base of the package 104 by an adhesive.

The Peltier element 101 can be switched between a state where the light-emitting element 102 side is a heat generation side and a state where the light-emitting element 102 side is a heat absorption side, depending on a direction of the supplied current. Therefore, even when a range of an environment temperature is wide, the temperatures of the light-emitting element 102 and the like can each be adjusted to a desired temperature, that is, a target temperature. Thereby, an adverse effect due to a temperature change, such as a change in wavelengths of the light beams LL, can be further reduced. Here, the target temperature of the light-emitting element 102 is determined according to the characteristics of the light-emitting element 102, and is not particularly limited. For example, the target temperature of the light-emitting element 102 is approximately a temperature from 30° C. to 40° C. The light-emitting element 102 and the temperature sensor 103 are provided on the Peltier element 101.

The light-emitting element 102 is, for example, a vertical cavity surface emitting laser, that is, a semiconductor laser such as a VCSEL. The semiconductor laser can emit two types of light beams having different wavelengths by superimposing a high-frequency signal on a DC bias current, that is, by applying modulation. In the present embodiment, the light beams emitted from the light-emitting element 102 are linearly-polarized light beams. The temperature sensor 103 is, for example, a temperature detection element such as a thermistor or a thermocouple.

Optical System Unit

As illustrated in FIG. 2, the optical system unit 30 includes the dimming filter 301, the condensing lens 302, the quarter-wavelength plate 303, and a holder 304 that holds the components. Here, the holder 304 includes a through hole 305 of which the both end portions are opened. The through hole 305 is a region through which the light beams LL pass. In the through hole 305, the dimming filter 301, the condensing lens 302, and the quarter-wavelength plate 303 are arranged side by side in this order along the optical axis a of the light beams LL. As illustrated in FIG. 3, each of the dimming filter 301, the condensing lens 302, and the quarter-wavelength plate 303 is fixed to the holder 304 by an adhesive or the like (not illustrated). The holder 304 is made of, for example, a metal material such as aluminum, and has a heat dissipation property.

As described above, the dimming filter 301 has a function of decreasing the intensity of the light beams LL from the light-emitting element 102. The dimming filter 301 is not particularly limited, and may be an absorption type dimming filter or a reflection type dimming filter. Further, the condensing lens 302 has a function of adjusting emission angles of the light beams LL such that the light beams LL are made close to, for example, parallel light beams. Thereby, it is possible to reduce a change in power density of the light beams LL in the atom cell 201 in a traveling direction, and thus it is possible to prevent expansion of a line width of the EIT signal. Thereby, it is possible to improve an oscillation characteristic of the atomic oscillator 1, particularly, short-term frequency stability. In addition, the quarter-wavelength plate 303 has a function of converting the two types of light beams having different frequencies, which are included in the light beams LL, from linearly-polarized light beams to circularly-polarized light beams, that is, right handed circularly-polarized light beams or left handed circularly-polarized light beams. Thereby, the intensity of the EIT signal can be increased by interaction with the magnetic fields from the coil 205.

In the optical system unit 30, the dimming filter 301 may be omitted depending on, for example, the intensity of the light beams LL from the light-emitting element 102. The optical system unit 30 may include an optical element other than the dimming filter 301, the condensing lens 302, and the quarter-wavelength plate 303. Further, the arrangement order of the dimming filter 301, the condensing lens 302, and the quarter-wavelength plate 303 is not limited to the order illustrated in FIGS. 1 to 3, and is arbitrary. Further, postures of the dimming filter 301, the condensing lens 302, and the quarter-wavelength plate 303 are arbitrary.

Atom Cell Unit

As described above, the atom cell unit 20 includes the atom cell 201, the light-receiving element 202, the heater 203, the temperature sensor 204, and the coil 205. In addition to the components, as illustrated in FIG. 4, the atom cell unit 20 includes a holding member 206 that holds the atom cell 201, a heat transfer member 210 that is fixed to the holding member 206, a first shield 207 that accommodates the atom cell 201, the light-receiving element 202, the temperature sensor 204, the coil 205, the holding member 206, and the heat transfer member 210, a second shield 208 that accommodates the first shield 207, a plurality of spacers 209 that are disposed between the first shield 207 and the second shield 208, a temperature control element 212, and a temperature sensor 213.

The atom cell 201 is filled with gaseous alkali metals such as rubidium, cesium, or sodium. Further, the atom cell 201 may be filled with a rare gas such as argon or neon, or an inert gas such as nitrogen, as a buffer gas, together with the alkali metal atoms in a gas state, when necessary.

The atom cell 201 includes a body portion 201a, which includes two columnar-shaped through holes, and a pair of window portions 201b and 201c, which are bonded to the body portion 201a. An airtightly-sealed internal space S is formed by the body portion 201a and the window portions 201b and 201c.

In the present embodiment, the internal space S includes a space S1 through which the light beams LL pass and a space S2 which communicates with the space S1 and in which the alkali metal atoms in a solid state or a liquid state (not illustrated) are accommodated. Here, the light beams LL are incident on the one window portion 201b, and transmit through the space S1. The light beams LL emitted from the space S1 transmit through the other window portion 201c. The internal space S is not limited to the form including the spaces S1 and S2 as described above. For example, the space S2 may be omitted. In other words, without providing a wall separating the space S1 and the space S2, the alkali metal atoms in a solid state or a liquid state may be disposed at a position corresponding to the space S2.

A material of the window portions 201b and 201c is not particularly limited as long as the material has a property of transmitting the light beams LL, and examples of the material include a glass material, crystal, and the like. On the other hand, a material of the body portion 201a is not particularly limited, and examples of the material include a metal material, a glass material, a silicon material, a crystal, and the like. From a viewpoint of workability and bonding of the window portions 201b and 201c, a glass material or a silicon material is preferably used. Further, a method of bonding the body portion 201a and the window portions 201b and 201c is determined according to the materials of the body portion 201a and the window portions 201b and 201c, and is not particularly limited. For example, a direct bonding method, an anode bonding method, a melt bonding method, an optical bonding method, or the like may be used.

As illustrated in FIG. 4, the holding member 206 is configured with two blocks 206a and 206b provided so as to cover the outer surface of the atom cell 201 while avoiding a region through which the light beams LL pass. Here, each of the two blocks 206a and 206b has a thermal conductivity of 10 $W \cdot m^{-1} \cdot K^{-1}$ or more, and is made of a material that does not inhibit the magnetic fields from the coil 205 to the atom cell 201, for example, a nonmagnetic metal material such as aluminum. Further, in the holding member 206, an opening 206c through which the light beams LL incident on the atom cell 201 pass and an opening 206d through which the light beams LL emitted from the atom cell 201 pass are provided. In the following, a fact that each of the blocks has a thermal conductivity of 10 $W \cdot m^{-1} \cdot K^{-1}$ or more may be expressed as that each of the blocks has an "excellent thermal conductivity", a "good thermal conductivity", or the like.

The block 206a is thermally coupled to a portion of the outer surface of the atom cell 201 on the space S1 side. Specifically, the block 206a is contacted with a portion of the outer surface of the atom cell 201 on the space S1 side, or is coupled to a portion of the outer surface of the atom cell 201 on the space S1 side via a member such as a metal having an excellent thermal conductivity. The block 206a is thermally coupled to the heater 203 via the first shield 207.

Thereby, the atom cell 201, more specifically, the space S1 can be heated by the heat from the heater 203. As described above, by interposing the block 206a between the atom cell 201 and the heater 203, a distance between the atom cell 201 and the heater 203 is increased, and thus it is possible to prevent unnecessary magnetic fields generated by energization to the heater 203 from adversely affecting the alkali metal atoms in the atom cell 201. Further, there is an advantage that the number of heaters can be reduced as compared with a configuration in which the heaters are in contact with the atom cell 201.

On the other hand, the block 206b is thermally coupled to a portion of the outer surface of the atom cell 201 on the space S2 side. Specifically, the block 206b is contacted with a portion of the outer surface of the atom cell 201 on the space S2 side, or is coupled to a portion of the outer surface of the atom cell 201 on the space S2 side via a member such as a metal having an excellent thermal conductivity. The block 206b is separated from the block 206a. For this reason, the block 206b is less likely to be affected by the heat from the heater 203 than the block 206a is affected. Thereby, the temperature of the space S2 can be made lower than the temperature of the space S1. Therefore, the alkali metal atoms in a solid state or a liquid state can be stably present in the space S2.

The shapes of the blocks 206a and 206b are not limited to the illustrated shapes as long as the heat from the heater 203 can be transferred to the space S1 while allowing the light beams LL to pass through the space S1. In the holding member 206, the blocks 206a and 206b may be integrated, or each of the blocks 206a and 206b may be configured with a plurality of members.

On the outer circumference of the holding member 206, the coil 205 is disposed, the coil being wound such that the central axis is along the optical axis a of the light beams LL. The coil 205 is a solenoid type coil or a pair of Helmholtz type coils. The coil 205 generates magnetic fields in the atom cell 201 in a direction along the optical axis a of the light beams LL, that is, in a direction parallel to the optical axis a of the light beams LL. Thereby, a gap between different degenerated energy levels of the alkali metal atoms in the atom cell 201 can be widened by Zeeman splitting, and thus resolution can be improved. Therefore, it is possible to reduce a line width of the EIT signal. The magnetic fields generated by the coil 205 may be direct-current magnetic fields or alternating-current magnetic fields, or may be magnetic fields obtained by superimposing direct-current magnetic fields and alternating-current magnetic fields.

The light-receiving element 202 and the temperature sensor 204 are disposed in the opening 206d of the holding member 206. The light-receiving element 202 is not particularly limited as long as the light-receiving element 202 can detect the light beams LL transmitted through the atom cell 201, that is, the intensity of the resonance light pair. For example, as the light-receiving element 202, a photodetector such as a photodiode may be used. The temperature sensor 204 is not particularly limited as long as the temperature sensor 204 can detect the temperature of the atom cell 201 or the heater 203. For example, various known temperature sensors such as a thermistor and a thermocouple may be used.

Here, the light-receiving element 202 and the temperature sensor 204 are disposed on a flexible wiring board 508b to be described. The flexible wiring board 508b includes a wiring 510 that is electrically coupled to the light-receiving element 202 and the temperature sensor 204, and is fixed to the holding member 206 by being interposed between the holding member 206 and the heat transfer member 210. Thereby, the light-receiving element 202 and the temperature sensor 204 can be positioned with respect to the atom cell 201.

The heat transfer member 210 has a thermal conductivity, and is thermally coupled to the holding member 206 and the flexible wiring board 508b. The heat transfer member 210 is also thermally coupled to the heater 203 via the holding member 206. Thereby, the heat transfer member 210 can conduct the heat from the holding member 206 to the flexible wiring board 508b and the light-receiving element 202. In the present embodiment, as illustrated in FIGS. 4 and 5, the heat transfer member 210 has a plate shape, is disposed along the YZ plane, and is fixed to the block 206a of the holding member 206 by being screwed using a screw 211.

Further, as illustrated in FIGS. 4 and 5, the heat transfer member 210 is provided so as to cover the opening 206d of the holding member 206 as much as possible. Thereby, the heat transfer member 210 can conduct the heat integrally with the holding member 206. Further, when viewed along the optical axis a, the heat transfer member 210 overlaps with the light-receiving element 202 and the temperature sensor 204. Thereby, the heat from the heat transfer member 210 is likely to be conducted to the light-receiving element 202 and the temperature sensor 204.

As the material of the heat transfer member 210, a material that has an excellent thermal conductivity and does not inhibit the magnetic fields from the coil 205 to the atom cell 201, for example, a nonmagnetic metal material such as copper or aluminum, a carbon fiber reinforced plastic (CFRP) material, a resin material to which a filler such as silica having a thermal conductivity is added, or the like may be used.

The thermal conductivity of the material of the heat transfer member 210 is preferably 10 $W \cdot m^{-1} \cdot K^{-1}$ or more, more preferably 20 $W \cdot m^{-1} \cdot K^{-1}$ or more, and further more preferably 100 $W \cdot m^{-1} \cdot K^{-1}$ or more. Thereby, a portion of the wiring 510 that is in the vicinity of the light-receiving element 202 can be suitably heated by the heat transfer member 210. On the other hand, when the thermal conductivity is too low, a gradient in the temperature of the heat transfer member 210 tends to occur.

As illustrated in FIG. 4, the atom cell 201, the light-receiving element 202, the temperature sensor 204, the coil 205, the holding member 206, and the heat transfer member 210 are accommodated in the first shield 207 as a shield. The first shield 207 supports the atom cell 201 via the holding member 206. Thus, the first shield 207 is thermally coupled to the atom cell 201 via the holding member 206. In addition, an opening 207a is provided in the first shield 207, the opening 207a being an opening that allows the light beams LL incident on the space S1 of the atom cell 201 to pass. Further, the first shield 207 includes a portion 207b which faces the heat transfer member 210 in a separated state. The first shield 207 may be in contact with the heat transfer member 210.

Here, as the material of the first shield 207, preferably, a material having an excellent thermal conductivity and a magnetic shielding property is used. Specifically, an iron-based alloy such as iron, Kovar, permalloy, or stainless steel is preferably used. Since the first shield 207 has an excellent thermal conductivity, the heat from the heater 203 can be efficiently conducted to the holding member 206. In addition, a distribution of the temperature of the first shield 207 can be made uniform, and thus a gradient in the temperature around the atom cell 201 can be reduced. Further, since the first shield 207 has a magnetic shielding property, it is possible to reduce a change in the magnetic fields in the first shield 207, particularly, in the atom cell 201, due to external magnetic fields.

As illustrated in FIG. 4, the first shield 207 is accommodated in the second shield 208. The second shield 208 supports the first shield 207 via a plurality of spacers 209, and is separated from the first shield 207. As a result, a gap is formed between the first shield 207 and the second shield 208, and the gap functions as a heat insulating layer. Therefore, heat transfer between the first shield 207 and the second shield 208 can be reduced. Here, preferably, each spacer 209 is made of a heat insulating material, for example, a resin material such as a polyimide resin or an acrylic resin. Thereby, heat transfer between the first shield 207 and the second shield 208 via the spacers 209 can be reduced. In addition, an opening 208a is provided in the second shield 208, the opening 208a being an opening that allows the light beams LL incident on the space S1 of the atom cell 201 to pass.

Here, similar to the first shield 207, as the material of the second shield 208, preferably, a material having an excellent thermal conductivity and a magnetic shielding property is used. Specifically, an iron-based alloy such as iron, Kovar, permalloy, or stainless steel is preferably used. Thereby, it is possible to reduce a change in the magnetic fields in the second shield 208, particularly, in the atom cell 201, due to external magnetic fields.

The heater 203 that is thermally coupled to the first shield 207 is provided in the second shield 208. In the illustrated configuration, the heater 203 is embedded in the second shield 208 so as to be in contact with the first shield 207. The heater 203 is not particularly limited as long as the heater 203 can heat the atom cell 201, more specifically, the alkali metal atoms in the atom cell 201. For example, various heaters including a heating resistor, a Peltier element, or the like may be used.

The temperature control element 212 is provided on the outer surface of the second shield 208 in the positive Z axis. The temperature control element 212 has a function of controlling the temperature of the atom cell 201 by cooling and heating the atom cell 201, and may be configured with, for example, a Peltier element or the like. Preferably, the temperature control element 212 controls the temperature of the atom cell 201 to a temperature lower than the temperature of the heater 203. The temperature control element 212 controls the temperature of the inside of the second shield 208 by controlling the temperature of the second shield 208. Thereby, the temperature of the first shield 207 accommodated in the second shield 208 is controlled.

As illustrated in FIG. 4, the temperature sensor 213 is provided inside the first shield 207 and in the vicinity of the block 206b. The temperature sensor 213 is thermally coupled to the block 206b, and detects the temperature of the block 206b. Based on the detection result, the temperature control circuit 501 controls an operation of the temperature control element 212. The temperature sensor 213 is not particularly limited as long as the temperature sensor 213 can detect the temperature of the block 206b. For example, various known temperature sensors such as a thermistor and a thermocouple may be used.

Support Member

Returning to FIG. 2, the support member 40 has a plate shape, and the atom cell unit 20 and the optical system unit 30 are mounted on one surface of the support member 40. The support member 40 includes a mounting surface 401 along a shape of a lower surface of the holder 304 of the optical system unit 30. A stepped portion 402 is formed on the mounting surface 401. The stepped portion 402 engages with a stepped portion of the lower surface of the holder 304, and restricts movement of the holder 304 to the atom cell unit 20 side, that is, to the right side in FIG. 2. Similarly, the support member 40 includes amounting surface 403 along a shape of a lower surface of the second shield 208 of the atom cell unit 20. A stepped portion 404 is formed on the mounting surface 403. The stepped portion 404 engages with an end surface of the second shield 208, that is, an end surface of the second shield 208 on a left side in FIG. 2, and restricts movement of the second shield 208 to the optical system unit 30 side, that is, to the left side in FIG. 2.

As described above, a relative position relationship between the atom cell unit 20 and the optical system unit 30 can be defined by the support member 40. Since the light-emitting element module 10 is fixed to the holder 304, the relative position relationship of the light-emitting element module 10 with respect to the atom cell unit 20 and the optical system unit 30 is also defined. Here, each of the second shield 208 and the holder 304 is fixed to the support member 40 by a fixing member such as a screw (not illustrated). The support member 40 is fixed to the package 60 by a fixing member such as a screw (not illustrated). Further, the support member 40 is configured with, for example, a metal material such as aluminum, and has a heat dissipation property. Thereby, heat dissipation of the light-emitting element module 10 can be efficiently performed.

Control Circuit

As illustrated in FIG. 3, the control circuit 50 includes a circuit board 505, two connectors 506a and 506b provided on the circuit board 505, a flexible wiring board 508a that couples the connector 506a and the light-emitting element module 10, a flexible wiring board 508b that couples the connector 506b and the atom cell unit 20, and a plurality of lead pins 509 that penetrates the circuit board 505.

Here, an electric circuit (not illustrated) is provided on the circuit board 505, and the electric circuit functions as the temperature control circuit 501, the light source control circuit 502, the magnetic field control circuit 503, and the temperature control circuit 504. The circuit board 505 includes a through hole 5051 into which the support member 40 is inserted. The circuit board 505 is supported to the package 60 via the plurality of lead pins 509. Each of the plurality of lead pins 509 penetrates the inside and outside of the package 60, and is electrically coupled to the circuit board 505.

The configuration which electrically couples the circuit board 505 and the light-emitting element module 10 and the configuration which electrically couples the circuit board 505 and the atom cell unit 20 are not limited to the connectors 506a and 506b and the flexible wiring boards 508a and 508b, and may be other known connectors and wirings.

Similar to the first shield 207 and the second shield 208, preferably, the package 60 is made of a metal material such as Kovar having a magnetic shielding property. Thereby, an adverse affect on the characteristics of the atomic oscillator 1 due to external magnetic fields can be reduced. The inside of the package 60 may be depressurized, or may be in an atmospheric pressure. Preferably, the inside of the package 60 is an airtight space.

As illustrated in FIG. 6, the first shield 207 that accommodates the atom cell 201, the block 206a, and the block 206b includes a first member 6A and a second member 6B, and is configured with an assembly in which the two members are assembled. In the assembled state, the first shield 207 has a hexahedral box shape. In FIG. 6, thermal coupling is typically illustrated by an arrow, and thermal coupling other than the illustrated arrow is omitted.

As illustrated in FIG. 6, the first shield 207 in the assembled state is a hexahedron including a wall 61, a wall 62, a wall 63, a wall 64, a wall 65, and a wall 66.

The wall 61 is located on a side of the first shield 207 on the negative X axis, and is a plate-shaped body that is disposed in a state where the thickness direction is along the X axis. In addition, an opening 207a is formed in the wall 61. Although not illustrated in FIG. 6, as illustrated in FIG. 4, the wall 61 is fixed to the block 206b by a screw 214. Thus, the block 206b and the wall 61 are thermally coupled to each other via the screw 214.

The wall 62 is located on a side of the first shield 207 on the positive Z axis, and is a plate-shaped body that is disposed in a state where the thickness direction is along the Z axis. Further, the wall 62 is disposed closest to the temperature control element 212 among the walls 61 to 66. Thus, the wall 62 is thermally coupled to the temperature control element 212.

The wall 63 is located on a side of the first shield 207 on the positive X axis, and is a plate-shaped body that is disposed in a state where the thickness direction is along the X axis. The wall 64 is located on a side of the first shield 207 on the negative Z axis, and is a plate-shaped body that is disposed in a state where the thickness direction is along the Z axis. Although not illustrated in FIG. 6, as illustrated in FIG. 5, the wall 64 is fixed to the block 206a by a screw 215. Thus, the block 206a and the wall 64 are thermally coupled to each other via the screw 215.

The wall 65 is located on a side of the first shield 207 on the positive Y axis, and is a plate-shaped body that is disposed in a state where the thickness direction is along the Y axis. Further, the wall 65 is in contact with the heater 203, and is thermally coupled to the heater 203. The wall 66 is located on a side of the first shield 207 on the negative Y axis, and is a plate-shaped body that is disposed in a state where the thickness direction is along the Y axis.

In the first shield 207 in the assembled state, the wall 61 and the wall 63 face each other, the wall 62 and the wall 64 face each other, and the wall 65 and the wall 66 face each other. The thicknesses of the wall 61 to the wall 66 may be appropriately set according to desired characteristics.

Here, as described above, the first shield 207 includes the two members of the first member 6A and the second member 6B. The first member 6A is formed by integrally forming the wall 61 and the wall 62, and is configured with one member. On the other hand, the second member 6B is formed by integrally forming the wall 63, the wall 64, the wall 65, and the wall 66, and is configured with one member. The method of integrally forming the two members refers to, for example, a method of forming each wall by bending one plate member or a method of bonding each plate member, especially, a method of welding each plate member.

When the first member 6A and the second member 6B are formed as separate members, the first shield 207 includes a high thermal resistance portion 6C having a thermal resistance higher than thermal resistances of the first member 6A and the second member 6B at a portion between the first member 6A and the second member 6B, that is, at a boundary portion between the first member 6A and the second member 6B.

The high thermal resistance portion 6C refers to a portion having a low thermal conductivity, compared to a case where the first member 6A and the second member 6B are integrally formed, that is, a case where the first member 6A and the second member 6B are made of the same material and are coupled to each other with the same wall thickness. Specifically, the high thermal resistance portion 6C may be, for example, a gap formed between the first member 6A and the second member 6B, a coupling portion that couples the first member 6A and the second member 6B and has a thickness thinner than the wall thicknesses of the first member 6A and the second member 6B, a member that is disposed between the first member 6A and the second member 6B and has a thermal conductivity lower than those of the first member 6A and the second member 6B, the member may include a filler, or the like. Further, the high thermal resistance portion 6C may be a portion obtained by a combination of two or more among the gap, the coupling portion, the member, and the filler.

Here, as described above, the temperature of the first shield 207 is controlled by the temperature control element 212. The wall 62 of the first member 6A and the atom cell 201 are thermally coupled to each other via the wall 61 that is integrally formed with the wall 62, the screw 214 that fixes the wall 61 and the block 206b, and the block 206b. Thereby, it is possible to control a temperature of a portion of the atom cell 201 at which the temperature control element 212 is thermally coupled via the first member 6A, with high accuracy. The wall 62 and the block 206b are also thermally coupled to each other via an adhesive or the like having an excellent thermal conductivity. Thus, heat may be transferred through a path without passing the screw 214. The temperature control element 212 and the first member 6A may be thermally coupled to each other by a member having an excellent thermal conductivity. For example, the second shield 208 and the first member 6A may be coupled to each other by a metal screw, a metal plate, or the like. Thereby, it is possible to control a temperature of a portion of the atom cell 201 at which the temperature control element 212 is thermally coupled via the first member 6A, with higher accuracy.

On the other hand, the wall 65 of the second member 6B is thermally coupled to the heater 203, and the heater 203 and the atom cell 201 are thermally coupled to each other via the wall 64 that is integrally formed with the wall 65, the screw 215 that fixes the wall 64 and the block 206a, and the block 206a. Thereby, the heater 203 can heat the atom cell 201 with high accuracy. The wall 65 and the block 206a are also thermally coupled to each other, and the wall 63 and the wall 66 are also thermally coupled to the block 206a via an adhesive having an excellent thermal conductivity. Thus, the heat of the heater 203 may be transferred to the atom cell 201 through a path without passing the screw 215.

In the following, as illustrated in FIG. 4, in the atom cell 201, a portion that is thermally coupled to the first member 6A is referred to as a first portion 201d, and a portion that is thermally coupled to the second member 6B is referred to as a second portion 201e. The first portion 201d and the second portion 201e may not have a clear boundary.

As described above, the first member 6A and the second member 6B are formed as separate members, and the high thermal resistance portion 6C is formed between the first member 6A and the second member 6B. Thus, it can be said that the heat path between the temperature control element 212 and the first portion 201d of the atom cell 201 and the heat path between the heater 203 and the second portion 201e of the atom cell 201 are independent from each other, that is, are unlikely to be affected by each other. Thereby, it is possible to control each of the first portion 201d of the atom cell 201 and the second portion 201e of the atom cell 201 to a desired temperature. That is, it is possible to make the atom cell 201 have a desired temperature distribution. As a result, the frequency stability of the atomic oscillator 1 can be improved.

As described above, the block 206b is disposed between the first portion 201d of the atom cell 201 and the first member 6A, the block 206b being a first holding member for thermally coupling the first portion 201d of the atom cell 201 and the first member 6A and holding the atom cell 201. Further, the block 206a is disposed between the second portion 201e of the atom cell 201 and the second member 6B, the block 206a being a second holding member for thermally coupling the second portion 201e of the atom cell 201 and the second member 6B and holding the atom cell 201. Thereby, the temperature of the first portion 201d can be more effectively controlled by the temperature control element 212, and the heater 203 and the second portion 201e can be more effectively thermally-coupled to each other. Therefore, a desired temperature distribution of the atom cell 201 can be realized with higher accuracy.

The first portion 201d is cooled by the temperature control element 212, and the alkali metal atoms in a liquid state or a solid state are accommodated inside the first portion 201d. Thereby, the alkali metal atoms in a liquid state or a solid state can be accommodated in a portion away from the portion through which the light beams LL pass, and the frequency stability of the atomic oscillator 1 can be improved. By increasing the temperature of the first portion 201d, the alkali metal atoms in a liquid state or a solid state become a gas.

In the first member 6A, a space is formed between the wall 61, the wall 63, and the wall 62. In other words, the first member 6A includes an opening between the wall 61 and the wall 63 and along the positive Y axis and the negative Y axis on the wall 62. The wall 65 of the second member 6B, which is a portion coupled to the heater 203, faces the opening. Thereby, it is possible to prevent the walls of the hexahedron in the assembled state from being provided by being overlapped with each other. Further, the wall 65 and the wall 61 can be formed as separate members, and thus a desired temperature distribution of the atom cell 201 can be more effectively obtained.

Further, as described above, the first shield 207 as a shield is formed of a hexahedron, and at least one of the first member 6A and the second member 6B, in the present embodiment, the second member 6B includes two surfaces facing each other and a surface coupling the two surfaces among the six surfaces of the first shield 207. That is, the second member 6B includes two walls 65 and 66 facing each other and a wall 64 coupling the two walls 65 and 66 among the walls 61 to 66. Thereby, the magnetic fields along at least one of the X axis, the Y axis, and the Z axis can pass through the coupled three surfaces, and thus the magnetic shielding property can be improved.

In the present embodiment, the wall 64, the wall 65, and the wall 66 are integrally formed, and thus the magnetic fields along the Y axis can pass through the walls in order of the wall 65, the wall 64, and the wall 66, or in order of the wall 66, the wall 64, and the wall 65. Thereby, an especially excellent magnetic shielding property in relation to the magnetic fields along the Y axis can be exhibited.

In the present embodiment, although the second member 6B has a configuration including two surfaces facing each other and a surface coupling the two surfaces among the six surfaces of the first shield 207, the present disclosure is not limited thereto. For example, the first member 6A may have the configuration, and both of the first member 6A and the second member 6B may have the configuration as in a second embodiment, a third embodiment, and a fourth embodiment to be described.

As described above, the atomic oscillator 1 includes: an atom cell 201 in which alkali metal atoms are accommodated; a light-emitting element 102 that emits light beams LL for exciting the alkali metal atoms toward the atom cell 201; a first shield 207 as a shield that includes a first member 6A, a second member 6B, and a high thermal resistance portion 6C and accommodates the atom cell 201, the first member 6A and the second member 6B being members having a magnetic shielding property, and the high thermal resistance portion 6C being provided between the first member 6A and the second member 6B and having a thermal resistance higher than thermal resistances of the first member 6A and the second member 6B; a temperature control element 212 that controls a temperature of the first member 6A; a heater 203 that is thermally coupled to the second member 6B; and a light-receiving element 202 that receives light beams passing through the atom cell 201. Thereby, the heat path between the temperature control element 212 and the first portion 201d of the atom cell 201 and the heat path between the heater 203 and the second portion 201e of the atom cell 201 can be made independent from each other. Therefore, each of the first portion 201d and the second portion 201e can be controlled to a desired temperature. That is, the atom cell 201 can have a desired temperature distribution. As a result, the frequency stability of the atomic oscillator 1 can be improved.

Second Embodiment

Figure 7:
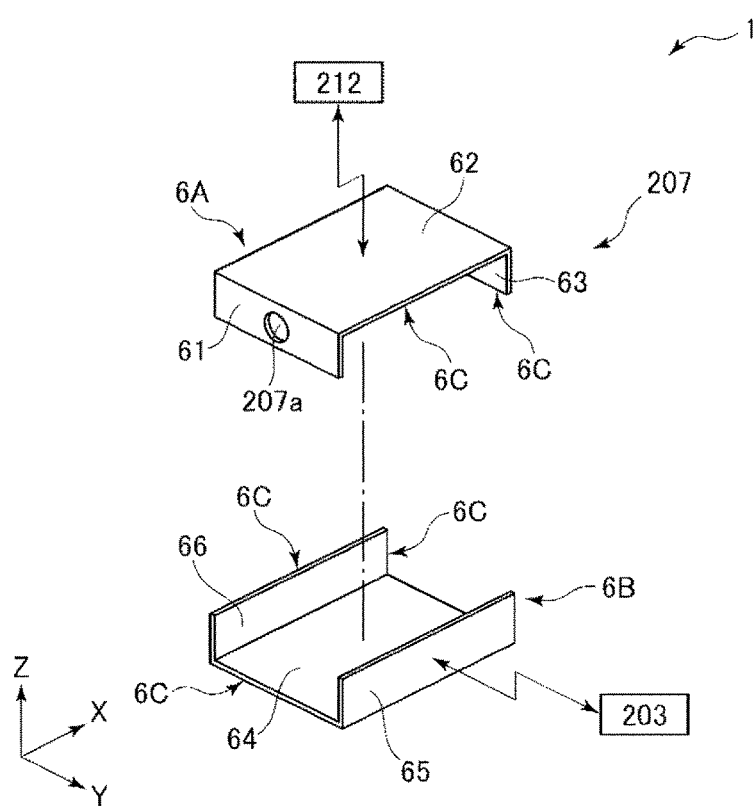
FIG. 7 is an exploded perspective view of the shield included in the atomic oscillator according to a second embodiment.

FIG. 7 is an exploded perspective view of a shield included in an atomic oscillator according to a second embodiment.

The present embodiment is the same as the first embodiment except that the shield has a different configuration. In the following description, the present embodiment will be described focusing on a difference from the first embodiment. The same components are denoted by the same reference numerals, and a description of the same components will be omitted.

As illustrated in FIG. 7, the first shield 207 includes a first member 6A and a second member 6B, and is an assembly in which the two members are assembled. In the present embodiment, the first member 6A includes a wall 61, a wall 62, and a wall 63, which are integrally formed. On the other hand, the second member 6B includes a wall 64, a wall 65, and a wall 66, which are integrally formed.

Even in the second embodiment, the heat path between the temperature control element 212 and the first portion 201d of the atom cell 201 and the heat path between the heater 203 and the second portion 201e of the atom cell 201 can be made independent from each other. Thus, the atom cell 201 can have a desired temperature distribution. As a result, the frequency stability of the atomic oscillator 1 can be improved.

In the present embodiment, the wall 61, the wall 62, and the wall 63 are integrally formed, and thus the magnetic fields along the X axis can pass through the walls in order of the wall 61, the wall 62, and the wall 63, or in order of the wall 63, the wall 62, and the wall 61. Similarly, the wall 64, the wall 65, and the wall 66 are continuously formed, and thus the magnetic fields along the Y axis can pass through the wall 64, the wall 65, and the wall 66. Thereby, an excellent magnetic shielding property in relation to the magnetic fields along the X axis and the magnetic fields along the Y axis can be exhibited.

Third Embodiment

Figure 8:
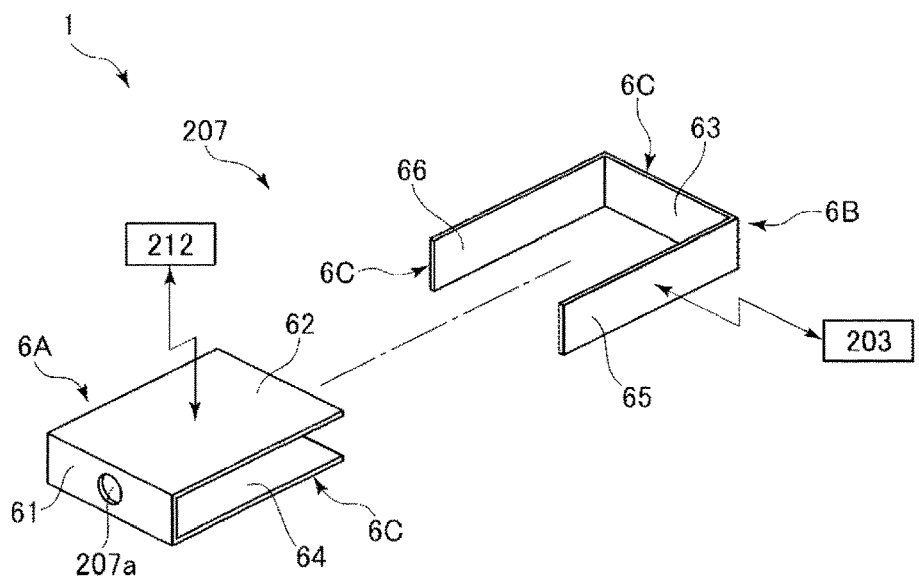
FIG. 8 is an exploded perspective view of the shield included in the atomic oscillator according to a third embodiment.

FIG. 8 is an exploded perspective view of a shield included in an atomic oscillator according to a third embodiment.

The present embodiment is the same as the first embodiment except that the shield has a different configuration. In the following description, the present embodiment will be described focusing on a difference from the first embodiment. A description of the same components will be omitted.

As illustrated in FIG. 8, the first shield 207 includes a first member 6A and a second member 6B, and is an assembly in which the two members are assembled. In the present embodiment, the first member 6A includes a wall 61, a wall 62, and a wall 64, which are integrally formed. On the other hand, the second member 6B includes a wall 63, a wall 65, and a wall 66, which are integrally formed.

Even in the third embodiment, the heat path between the temperature control element 212 and the first portion 201d of the atom cell 201 and the heat path between the heater 203 and the second portion 201e of the atom cell 201 can be made independent from each other. Thus, the atom cell 201 can have a desired temperature distribution. As a result, the frequency stability of the atomic oscillator 1 can be improved. In particular, according to the present embodiment, the first member 6A has a configuration including the wall 62 and the wall 64 facing each other on the Z axis. Thus, for example, when accommodating the atom cell 201 and the like inside the first member 6A and the second member 6B and assembling the first member 6A and the second member 6B, positioning is performed such that the atom cell 201 and the like are interposed between the wall 62 and the wall 64 of the first member 6A, and then the first member 6A and the second member 6B are assembled. That is, positioning of the atom cell 201 and the like to be accommodated and assembling of the first member 6A and the second member 6B can be sequentially performed. Therefore, assembling accuracy of the atom cell 201 can be further increased.

In the present embodiment, the wall 61, the wall 62, and the wall 64 are integrally formed, and thus the magnetic fields along the Z axis can pass through the walls in order of the wall 62, the wall 61, and the wall 64, or in order of the wall 64, the wall 62, and the wall 61. Thereby, an especially excellent magnetic shielding property in relation to the magnetic fields along the Z axis can be exhibited.

Fourth Embodiment

Figure 9:
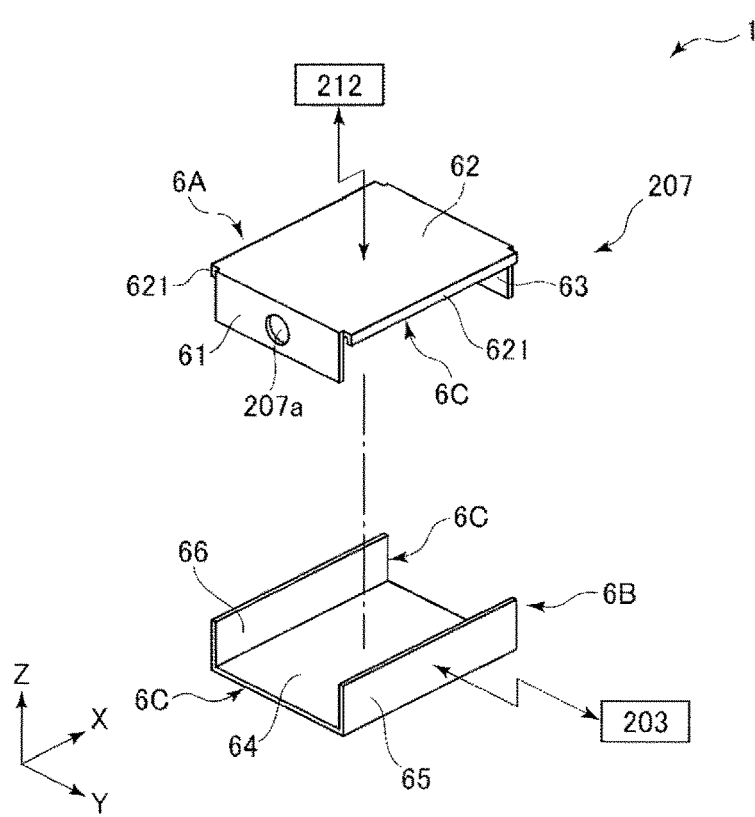
FIG. 9 is an exploded perspective view of the shield included in the atomic oscillator according to a fourth embodiment.

FIG. 9 is an exploded perspective view of a shield included in an atomic oscillator according to a fourth embodiment.

The present embodiment is the same as the first embodiment except that the shield has a different configuration. In the following description, the present embodiment will be described focusing on a difference from the first embodiment. A description of the same components will be omitted.

As illustrated in FIG. 9, the first shield 207 includes a first member 6A and a second member 6B, and is an assembly in which the two members are assembled. In the present embodiment, the first member 6A includes a wall 61, a wall 62, and a wall 63, which are integrally formed. On the other hand, the second member 6B includes a wall 64, a wall 65, and a wall 66, which are integrally formed.

The first member 6A includes walls 621 formed so as to be folded at edge portions of the wall 62 on the Y axis. Each of the walls 621 extends along the X axis.

In the assembled state, the walls 621 are disposed so as to respectively overlap with the walls 65 and 66.

Even in the fourth embodiment, the heat path between the temperature control element 212 and the first portion 201d of the atom cell 201 and the heat path between the heater 203 and the second portion 201e of the atom cell 201 can be made independent from each other. Thus, the atom cell 201 can have a desired temperature distribution. As a result, the frequency stability of the atomic oscillator 1 can be improved.

Further, by providing the walls 621, an especially excellent magnetic shielding property in relation to the magnetic fields along the Z axis can be exhibited.

A length of the wall 621 on the Z axis is preferably ⅓ or less of the length of the wall 65 or the wall 66 on the Z axis, and is more preferably ⅕ or less of the length of the wall 65 or the wall 66 on the Z axis. Thereby, it is possible to prevent heat transfer between the first member 6A and the second member 6B while ensuring an excellent magnetic shielding property.

Fifth Embodiment

Figure 10:
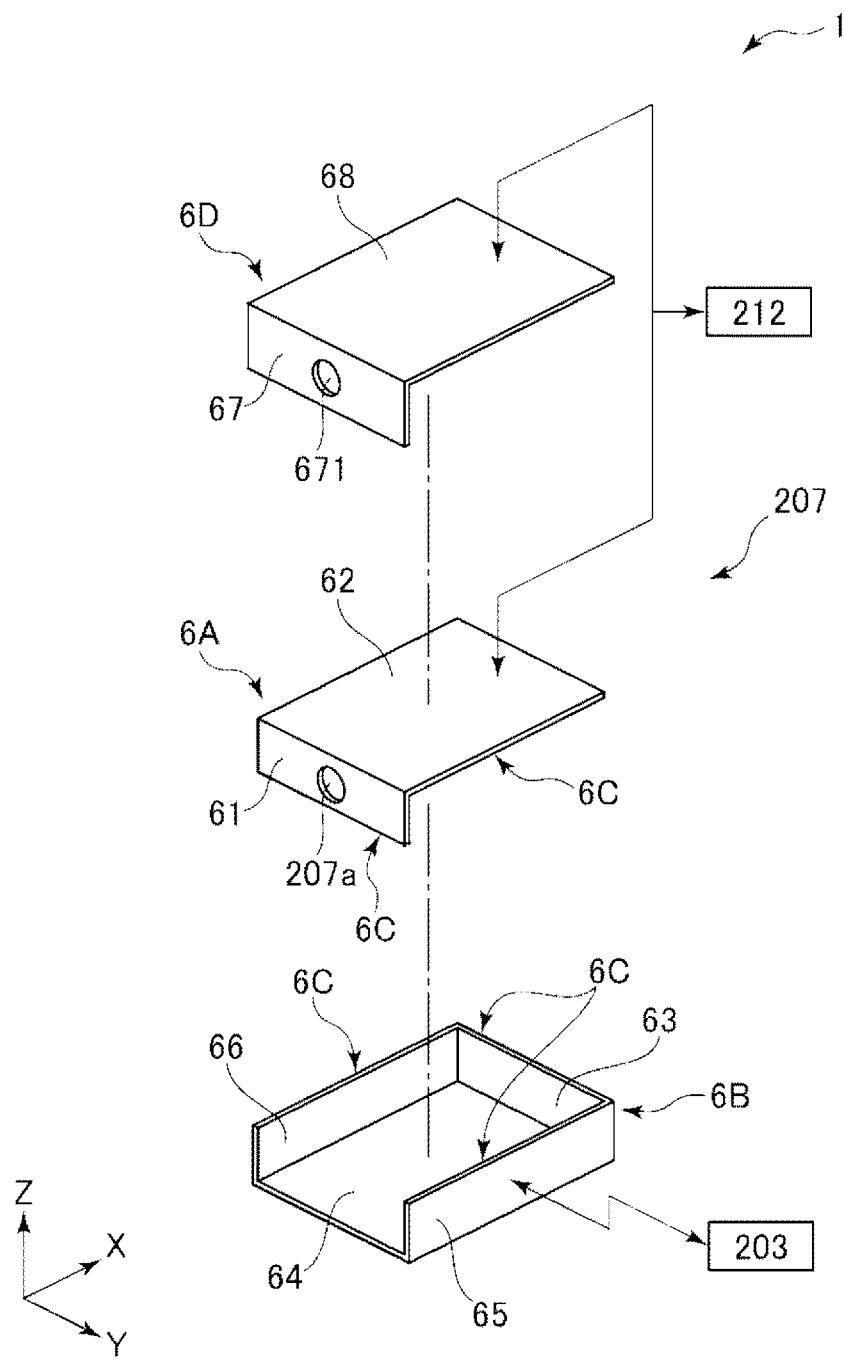
FIG. 10 is an exploded perspective view of the shield included in the atomic oscillator according to a fifth embodiment.

FIG. 10 is an exploded perspective view of a shield included in an atomic oscillator according to a fifth embodiment.

The present embodiment is the same as the first embodiment except that the shield has a different configuration. In the following description, the present embodiment will be described focusing on a difference from the first embodiment. A description of the same components will be omitted.

As illustrated in FIG. 10, the first shield 207 includes a first member 6A and a second member 6B, and is an assembly in which the two members are assembled. In the present embodiment, the first member 6A includes a wall 61 and a wall 62, which are integrally formed. On the other hand, the second member 6B includes a wall 63, a wall 64, a wall 65, and a wall 66, which are integrally formed.

The first member 6A is covered with a heat transfer layer 6D. The heat transfer layer 6D includes a first layer 67 and a second layer 68, which are coupled to each other. The first layer 67 covers a surface of the wall 61 of the first member 6A on the negative X axis side. Further, the first layer 67 includes an opening 671 at a position corresponding to the opening 207a of the wall 61. The second layer 68 covers a surface of the wall 62 of the first member 6A on the positive Z axis side. The heat transfer layer 6D is made of a material having a thermal conductivity higher than the thermal conductivity of the first shield 207, such as aluminum.

In the present embodiment, the heat transfer layer 6D for enhancing the thermal conductivity is disposed in the middle of the heat path between the first member 6A and the temperature control element 212. Thus, heat transfer between the first member 6A and the temperature control element 212 can be more efficiently and quickly performed.

In the present embodiment, although the heat transfer layer 6D is configured to cover both of the wall 61 and the wall 62 of the first member 6A, the present disclosure is not limited thereto. For example, the heat transfer layer 6D may be configured to cover only one of the wall 61 and the wall 62. Further, although the heat transfer layer 6D is configured to cover the first member 6A, the present disclosure is not limited thereto. For example, the heat transfer layer 6D may be configured to cover only the second member 6B or both of the first member 6A and the second member 6B. As described above, at least one of the first member 6A and the second member 6B is covered with the heat transfer layer 6D. Thereby, heat transfer between the first member 6A and the temperature control element 212 or thermal conductivity from the heater 203 to the second member 6B can be enhanced.

Although not illustrated in FIG. 10, when the wall 61 is fixed to the block 206b by the screw 214, preferably, the heat transfer layer 6D is fixed to the first member 6A by screwing. In this case, preferably, the heat transfer layer 6D is fixed to the first member 6A by screwing the screw 214 with a screw hole formed in the wall 61. Thereby, heat transfer between the screw 214 and the wall 61 is more efficiently performed.

Application Example of Atomic Oscillator

The above-described atomic oscillator 1 may be incorporated in various frequency signal generation systems. Hereinafter, an embodiment of such a frequency signal generation system will be described.

Figure 11:
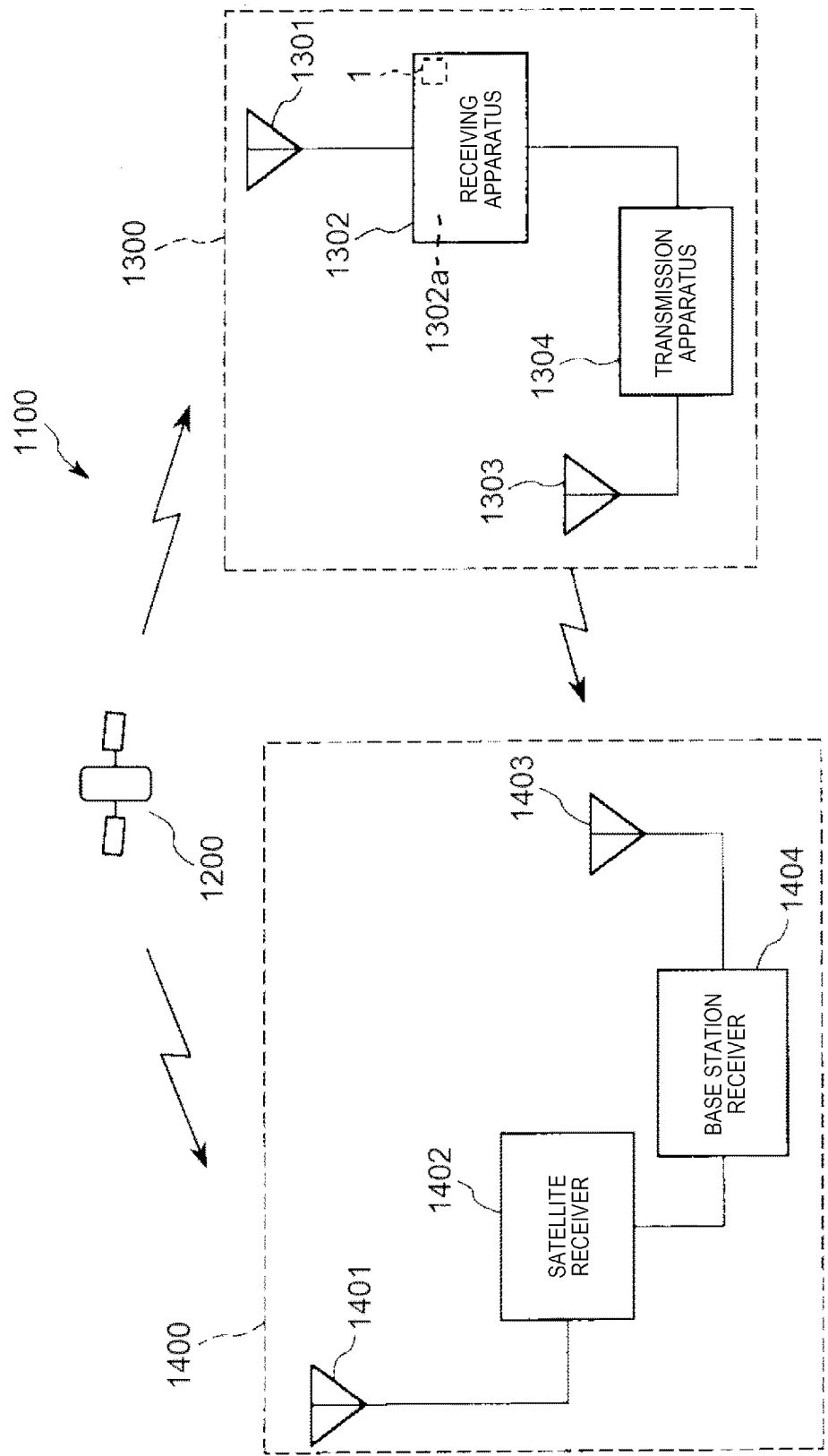
FIG. 11 is a diagram illustrating a schematic configuration of a positioning system using a global positioning system (GPS) satellite, that is, an example of a frequency signal generation system.

FIG. 11 is a diagram illustrating a schematic configuration of a positioning system using a global positioning system (GPS) satellite, that is, an example of a frequency signal generation system.

A positioning system 1100 illustrated in FIG. 11 includes a base station apparatus 1300 and a GPS receiving apparatus 1400. Here, an electronic apparatus including the atomic oscillator 1 may also be called a frequency signal generation system, and each of various systems configured with a plurality of electronic apparatuses including the atomic oscillator 1 may also be called a frequency signal generation system.

A GPS satellite 1200 transmits a satellite signal (GPS signal) including positioning information.

The base station apparatus 1300 includes, for example, a receiving apparatus 1302 that receives the satellite signal from the GPS satellite 1200 via an antenna 1301 provided in a GPS continuous observation station as an electronic reference point, and a transmission apparatus 1304 that transmits the positioning information acquired from the satellite signal received by the receiving apparatus 1302 via an antenna 1303.

Here, the receiving apparatus 1302 includes an atomic oscillator 1 as a reference frequency oscillation source, and a processor 1302a that processes a frequency signal from the atomic oscillator 1. In addition, the positioning information received by the receiving apparatus 1302 is transmitted by the transmission apparatus 1304 in real time.

As described above, the receiving apparatus 1302 as a frequency signal generation system includes the atomic oscillator 1. According to the receiving apparatus 1302, a gradient in the temperature around the atom cell 201 of the atomic oscillator 1 can be reduced, and thus it is possible to improve characteristics of the receiving apparatus 1302. Further, the receiving apparatus 1302 is included in the positioning system 1100, and thus it is possible to improve characteristics of the positioning system 1100 as another example of a frequency signal generation system.

The GPS receiving apparatus 1400 includes a satellite receiver 1402 that receives positioning information from the GPS satellite 1200 via an antenna 1401, and a base station receiver 1404 that receives positioning information from the base station apparatus 1300 via an antenna 1403.

As described above, the receiving apparatus 1302 of the positioning system 1100 as an example of a frequency signal generation system includes the atomic oscillator 1 and the processor 1302a that processes a frequency signal from the atomic oscillator 1.

Further, the atomic oscillator 1 includes: an atom cell 201 in which alkali metal atoms are accommodated; a light-emitting element 102 that emits light beams LL for exciting the alkali metal atoms toward the atom cell 201; a first shield 207 as a shield that includes a first member 6A, a second member 6B, and a high thermal resistance portion 6C and accommodates the atom cell 201, the first member 6A and the second member 6B being members having a magnetic shielding property, and the high thermal resistance portion 6C being provided between the first member 6A and the second member 6B and having a thermal resistance higher than thermal resistances of the first member 6A and the second member 6B; a temperature control element 212 that controls a temperature of the first member 6A; a heater 203 that is thermally coupled to the second member 6B; and a light-receiving element 202 that receives light beams passing through the atom cell 201.

According to such an aspect, it is possible to improve characteristics of the positioning system 1100 and the receiving apparatus 1302 by using advantages of the atomic oscillator 1.

The frequency signal generation system is not limited thereto, and may be any system including an atomic oscillator 1 and a processor that processes a frequency signal from the atomic oscillator 1. For example, the frequency signal generation system may be applied to a smart phone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation device, a pager, an electronic organizer (having a communication function), an electronic dictionary, a calculator, an electronic game device, a word processor, a work station, a video phone, a security TV monitor, an electronic binoculars, a point of sales (POS) terminal, a medical device (for example, an electronic thermometer, a blood pressure meter, a blood sugar meter, an electrocardiogram measuring device, a ultrasound diagnosis device, or an electronic endoscope), a fish finder, various measuring devices, instruments (for example, instruments for a vehicle, an aircraft, or a ship), a flight simulator, terrestrial digital broadcasting, a mobile phone base station, or the like. Further, the frequency signal generation system configured with a plurality of electronic apparatuses is not limited thereto as long as the frequency signal generation system is a system that generates a signal by processing the signal from the atomic oscillator 1. For example, the frequency signal generation system may be a clock transmission system or the like.

As described above, although the atomic oscillator and the frequency signal generation system according to the present disclosure have been described based on the embodiments illustrated in the drawings, the present disclosure is not limited thereto. Each component of the atomic oscillator and the frequency signal generation system may be replaced with any component having the same function. In addition, any component may be added.

In the embodiments, although the case where the present disclosure is applied to an atomic oscillator using a quantum interference effect has been described as an example, the present disclosure is not limited thereto. The present disclosure may be applied to an atomic oscillator using a double resonance phenomenon. In this case, the light source is not limited to a semiconductor laser, and for example, a light emitting diode, a lamp filled with an alkali metal, or the like may be used.

What is claimed is:

1. An atomic oscillator comprising:
an atom cell in which alkali metal atoms are accommodated;
a light-emitting element that emits light beams for exciting the alkali metal atoms toward the atom cell;
a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member;
a temperature control element that controls a temperature of the first member;
a heater that is thermally coupled to the second member;
a light-receiving element that receives light beams passing through the atom cell;
a first holding member that is thermally coupled to a first portion of the atom cell and the first member and holds the atom cell; and
a second holding member that is thermally coupled to a second portion of the atom cell and the second member and holds the atom cell, the second portion being different from the first portion.

2. The atomic oscillator according to claim 1, wherein alkali metal atoms in a liquid state or a solid state are accommodated in the first portion.

3. The atomic oscillator according to claim 1, wherein the first member includes an opening,
the second member includes a wall coupled to the heater, and
the wall faces the opening.

4. The atomic oscillator according to claim 1, wherein the shield is a hexahedron, and
at least one of the first member and the second member includes two surfaces facing each other and a surface coupling the two surfaces among six surfaces of the shield.

5. The atomic oscillator according to claim 1, wherein at least one of the first member and the second member is covered with a heat transfer layer.

6. The atomic oscillator according to claim 1, wherein the high thermal resistance portion includes at least one of a gap between the first member and the second member, a coupling portion that couples the first member and the second member and is thinner than a wall thickness of the first member and the second member, and a member that is disposed between the first member and the second member and has a thermal conductivity lower than thermal conductivity of the first member and the second member.

7. A frequency signal generation system comprising:
an atomic oscillator; and
a processor that processes a frequency signal from the atomic oscillator, wherein
the atomic oscillator includes
an atom cell in which alkali metal atoms are accommodated,
a light-emitting element that emits light beams for exciting the alkali metal atoms toward the atom cell,
a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member,
a temperature control element that changes a temperature of the first member,
a heater that is thermally coupled to the second member,
a light-receiving element that receives light beams passing through the atom cell,
a first holding member that is thermally coupled to a first portion of the atom cell and the first member and holds the atom cell, and
a second holding member that is thermally coupled to a second portion of the atom cell and the second member and holds the atom cell, the second portion being different from the first portion.

8. An atomic oscillator comprising:
an atom cell in which alkali metal atoms are accommodated;
a light-emitting element that emits light beams for exciting the alkali metal atoms toward the atom cell;
a shield that includes a first member, a second member, and a high thermal resistance portion and accommodates the atom cell, the first member and the second member being members having a magnetic shielding property, and the high thermal resistance portion being provided between the first member and the second member and having a thermal resistance higher than thermal resistances of the first member and the second member;
a temperature control element that controls a temperature of the first member;
a heater that is thermally coupled to the second member; and
a light-receiving element that receives light beams passing through the atom cell,
wherein the high thermal resistance portion includes at least one of a gap between the first member and the second member, a coupling portion that couples the first member and the second member and is thinner than a wall thickness of the first member and the second member, and a member that is disposed between the first member and the second member and has a thermal conductivity lower than thermal conductivity of the first member and the second member.

* * * * *